(12) United States Patent
Fujita et al.

(10) Patent No.: US 10,566,914 B2
(45) Date of Patent: Feb. 18, 2020

(54) TRANSDUCER AND ELECTRONIC DEVICE

(71) Applicant: SONY CORPORATION, Tokyo (JP)

(72) Inventors: Shuji Fujita, Tokyo (JP); Yukari Tsunoda, Tokyo (JP); Satoshi Nakamaru, Kanagawa (JP)

(73) Assignee: SONY CORPORATION, Tokyo (JP)

(*) Notice: Subject to any disclaimer, the term of this patent is extended or adjusted under 35 U.S.C. 154(b) by 309 days.

(21) Appl. No.: 15/504,462

(22) PCT Filed: Jun. 25, 2015

(86) PCT No.: PCT/JP2015/003191
§ 371 (c)(1),
(2) Date: Feb. 16, 2017

(87) PCT Pub. No.: WO2016/031111
PCT Pub. Date: Mar. 3, 2016

(65) Prior Publication Data
US 2017/0237366 A1    Aug. 17, 2017

(30) Foreign Application Priority Data

Aug. 25, 2014  (JP) .................. 2014-170763

(51) Int. Cl.
*H02N 2/00*     (2006.01)
*H01L 41/047*   (2006.01)
(Continued)

(52) U.S. Cl.
CPC .......... *H02N 2/001* (2013.01); *H01L 41/047* (2013.01); *H01L 41/0478* (2013.01);
(Continued)

(58) Field of Classification Search
CPC ...................................................... H02N 2/001
(Continued)

(56) References Cited

U.S. PATENT DOCUMENTS 9,051,446 B2 * 6/2015 Kobayashi ............ C08K 5/0091
9,156,261 B2 * 10/2015 Nakao ..................... B41J 2/161
(Continued)

FOREIGN PATENT DOCUMENTS

CA        2754705 A1     9/2010
CN      102341768 A     2/2012
(Continued)

OTHER PUBLICATIONS

International Search Report and Written Opinion of PCT Application No. PCT/JP2015/003191, dated Aug. 25, 2015, 08 pages of English Translation and 07 pages of ISRWO.
(Continued)

*Primary Examiner* — Thomas M Dougherty
*Assistant Examiner* — Karen B Addison
(74) *Attorney, Agent, or Firm* — Chip Law Group

(57) ABSTRACT

A transducer that converts electrical energy to mechanical energy, the transducer includes a dielectric layer; a first electrode that is provided on one surface of the dielectric layer; and a second electrode that is provided on another surface of the dielectric layer. At least one of the first electrode and the second electrode becomes an insulator, before the dielectric layer suffers insulation breakdown by voltage that is applied between the first electrode and the second electrode.

12 Claims, 1 Drawing Sheet

(51) Int. Cl.
    *H01L 41/09* (2006.01)
    *H02N 11/00* (2006.01)
    *H01L 41/193* (2006.01)
(52) U.S. Cl.
    CPC .......... *H01L 41/09* (2013.01); *H01L 41/0986* (2013.01); *H02N 11/00* (2013.01); *H01L 41/193* (2013.01)
(58) Field of Classification Search
    USPC .................................................. 310/365, 363
    See application file for complete search history.

(56) References Cited

U.S. PATENT DOCUMENTS

| 9,576,694 | B2* | 2/2017 | Gogotsi ................ H01M 4/583 |
| 2002/0050769 | A1 | 5/2002 | Pelrine et al. |
| 2012/0241689 | A1 | 9/2012 | Itou et al. |
| 2013/0044049 | A1 | 2/2013 | Biggs et al. |

FOREIGN PATENT DOCUMENTS

| CN | 102893342 A | 1/2013 |
| EP | 1848046 A2 | 10/2007 |
| EP | 2629304 A1 | 8/2013 |
| JP | 2003-505865 A | 2/2003 |
| JP | 2003-152234 A | 5/2003 |
| JP | 2009-59856 A | 3/2009 |
| JP | 2009-059856 A | 3/2009 |
| JP | 2010-053250 A | 3/2010 |
| JP | 2012-520516 A | 9/2012 |
| KR | 10-2013-0001305 A | 1/2013 |
| WO | 2001/006575 A1 | 1/2001 |
| WO | 2010/104953 A1 | 9/2010 |
| WO | 2012/050128 A1 | 4/2012 |

OTHER PUBLICATIONS

International Preliminary Report on Patentability of PCT Application No. PCT/JP2015/003191, dated Mar. 9, 2017, 08 pages of English Translation and 04 pages of IPRP.

Pelrine, et al., "High-Speed Electrically Actuated Elastomers with Strain Greater Than 100%", vol. 287, Science, Feb. 4, 2000, pp. 836-839.

La, et al., "Very High Dielectric Strength for Dielectric Elastomer Actuators in Liquid Dielectric Immersion", Applied Physics Letters 102, 192905, 2013, 06 pages.

* cited by examiner

TRANSDUCER AND ELECTRONIC DEVICE

CROSS REFERENCE TO RELATED APPLICATIONS

This application is a U.S. National Phase of International Patent Application No. PCT/JP2015/003191 filed on Jun. 25, 2015, which claims priority benefit of Japanese Patent Application No. JP 2014-170763 filed in the Japan Patent Office on Aug. 25, 2014. Each of the above-referenced applications is hereby incorporated herein by reference in its entirety.

TECHNICAL FIELD

The present technology relates to a transducer and an electronic device that includes the transducer. The detail relates to a transducer that converts electrical energy to mechanical energy.

BACKGROUND ART

It is expected that a transducer (a converter) that converts electrical energy to mechanical energy is applied to a wide variety of fields as an actuator of an antenna, a mobile device, an artificial muscle, and a speaker, for example.

Non-Patent Literature 1 describes a dielectric elastomer actuator that operates as an electromechanical transducer, by sandwiching an elastomer material (whose Young's modulus is 100 MPa or less) with two flexible electrodes.

Non-Patent Literature 2 describes reducing electric field strength by using only a region of a small displacement amount, and decreasing void portions by immersion in silicone oil or the like, in order to improve insulation destruction resistance in a dielectric elastomer actuator.

Patent Literature 1 describes using plant-based carbon black as a conductive filler that is mixed in a polymer of a base material of a conductive polymer composite material. Also, it is described that the plant-based carbon black has a hollow structure, and that the polymer of the base material is in the inner portion of this hollow structure.

CITATION LIST

Patent Literature

Patent Literature 1: JP 2010-53250A

Non-Patent Literature

Non-Patent Literature 1: R. Pelrine, R. Kornbluh, Q. Pei and J. Joseph, SCIENCE 287, 5454, (2000)
Non-Patent Literature 2: T-G La and G-K. Lau, Appl. Phys. Lett. 102, 192905 (2013)

DISCLOSURE OF INVENTION

Technical Problem

A purpose of the present technology is to provide a transducer of high insulation destruction resistance at the time of high voltage application and an electronic device that includes the transducer.

Solution to Problem

In order to solve the above-mentioned problem, a first technology provides a transducer that converts electrical energy to mechanical energy, the transducer including: a dielectric layer; a first electrode that is provided on one surface of the dielectric layer; and a second electrode that is provided on another surface of the dielectric layer. At least one of the first electrode and the second electrode becomes an insulator, before the dielectric layer suffers insulation breakdown by voltage that is applied between the first electrode and the second electrode.

A second technology provides an electronic device including: a transducer that converts electrical energy to mechanical energy. The transducer includes a dielectric layer, a first electrode that is provided on one surface of the dielectric layer, and a second electrode that is provided on another surface of the dielectric layer. At least one of the first electrode and the second electrode becomes an insulator, before the dielectric layer suffers insulation breakdown by voltage that is applied between the first electrode and the second electrode.

Advantageous Effects of Invention

As described above, the present technology can configure a transducer of high insulation destruction resistance at the time of high voltage application.

MODE(S) FOR CARRYING OUT THE INVENTION

An embodiment of the present technology will be described in the below order.
1 Configuration of Dielectric Actuator
2 Operation of Dielectric Actuator
3 Production Method of Dielectric Actuator
4 Effect
5 Exemplary Variant

[1 Configuration of Dielectric Actuator]

Figure 1:
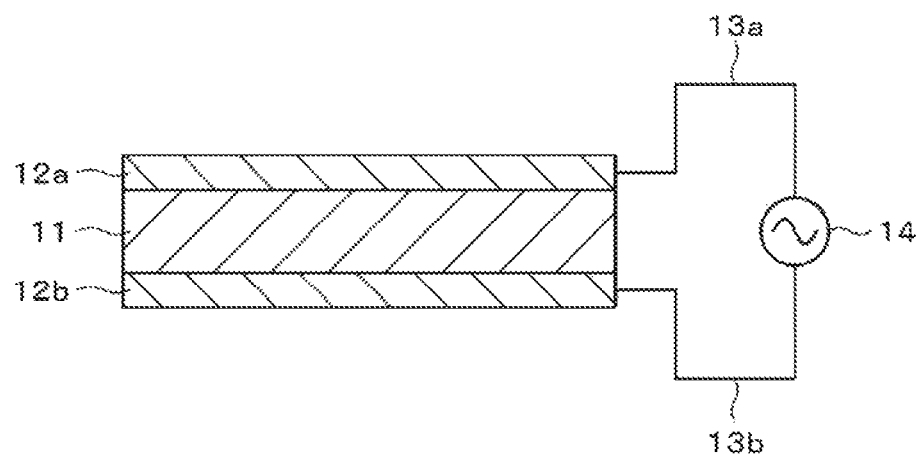
FIG. 1 is a cross-sectional view illustrating one exemplary configuration of a dielectric actuator according to an embodiment of the present technology.

As illustrated in FIG. 1, a dielectric actuator includes a dielectric layer 11, an electrode 12a that is provided on one surface of the dielectric layer 11, and an electrode 12b that is provided on another surface of the dielectric layer 11. The electrode 12a is provided directly on the one surface of the dielectric layer 11, and the electrode 12b is provided directly on the other surface of the dielectric layer 11. Note that, although not depicted, a bonding layer may be provided between the electrode 12a and the dielectric layer 11, and a bonding layer may be provided between the electrode 12b and the dielectric layer 11. Here, in a conceptual definition, the bonding layer includes an adhesive layer. The electrodes 12a, 12b are electrically connected to a power supply 14 via lines 13a, 13b, respectively. This dielectric actuator is an example of the transducer that converts electrical energy to mechanical energy.

Although FIG. 1 illustrates an example in which the dielectric actuator has a flat sheet shape, the shape of the dielectric actuator is not limited thereto, but may be a roll shape or the like. The dielectric actuator is transparent or opaque for light that includes a predetermined wavelength band. It is preferable that whether the dielectric actuator is either transparent or opaque is selected according to a target that the dielectric actuator is applied. Here, a predetermined band is a wavelength band of visible light or a wavelength band of infrared light, for example. The wavelength band of visible light is a wavelength band of 350 nm or more and 850 nm or less, and the wavelength band of infrared light is a wavelength band of more than 850 nm and 1 mm or less.

The dielectric actuator is a device that is preferably used in an artificial muscle, a medical device, a population chromatophore, an antenna, an electronic device, a sound converter (a speaker, etc.), a rehabilitation device, a robot, a robot suit, a micro device, a hand movement correction module, a vibrator, or the like. The electronic device is a personal computer, a mobile device, a mobile phone, a tablet computer, a display device, an image capturing device, an audio device, a game machine, or the like, for example, but is not limited thereto.

(Dielectric Layer)

The dielectric layer 11 is stretchable. The dielectric layer 11 has a film shape for example, but is not limited to this shape particularly. Here, in a conceptual definition, the film shape includes a sheet shape and a plate shape. The dielectric layer 11 includes an insulating elastomer as an insulating stretchable material, for example. The dielectric layer 11 may include a gel or the like as the insulating stretchable material, for example. The dielectric layer 11 may include an additive as necessary. For example, one or more of a cross-linker, a plasticizer, an age inhibitor, a surfactant, a viscosity modifier, a stiffener, a colorant, and the like can be used as the additive. For example, one or more of a silicone resin, an acrylic resin, and an urethane resin, and the like can be used, as the insulating elastomer. Pre-strain may be exerted on the dielectric layer 11. It is preferable that the Young's modulus of the dielectric layer 11 is 100 MPa or less. It is preferable that the dielectric layer 11 has a dielectric constant is equal to or larger than 2.

(Electrode)

The electrodes 12a, 12b are provided in such a manner that the main surfaces of the electrodes 12a, 12b face each other, and the dielectric layer 11 is provided between the main surfaces of both the electrodes 12a, 12b. The electrodes 12a, 12b are stretchable. Hence, the electrodes 12a, 12b can deform as the dielectric layer 11 deforms. Each of the electrodes 12a, 12b may have a thin film shape that covers the entirety or substantially entirety of the both surfaces of the dielectric layer 11, and may have a predetermined pattern. A predetermined pattern is a pattern such as stripe, dot, grid (matrix), concentric circle, and spiral, for example. The electrodes 12a, 12b has a film shape or a thin film shape for example, but is not limited to these shapes particularly.

The electrodes 12a, 12b includes conductive particles and, if necessary, a binder. It is preferable that, when the electrodes 12a, 12b include the binder, the conductive particles are dispersed in the binder. The electrodes 12a, 12b may further include an additive if necessary. It is preferable that porous carbon particles that include a large number of pores on the surfaces are used as the conductive particles. The porous carbon particles include, on the surfaces, mesopores of preferably a pore diameter (size) of 2 nm or more and 100 nm or less, more preferably a pore diameter of 2 nm or more and 50 nm or less, yet more preferably a pore diameter of 4 nm or more and 20 nm or less. In addition to the mesopores, the porous carbon particles further includes, on the surfaces, micropores of preferably a pore diameter of less than 2 nm, more preferably a pore diameter of 0.5 nm or more and less than 2 nm. It is preferable that the porous carbon particles that include the micropores and the mesopores include micropores of a pore diameter of 0.5 nm or more and less than 2 nm, and mesopores of a pore diameter of 4 nm or more and 20 nm or less.

The porous carbon particles that have the pores of the above pore diameter on the surface are biocarbon, for example. It is preferable that the biocarbon is made from a raw material that is a plant-derived material in which the content of silicon is 5 wt % or more, and has a value of a specific surface area by a nitrogen BET method being 10 $m^2/g$ or more, and includes silicon of a content of 1 wt % or less, and has a volume of pores by a BJH method and an MP method being 0.1 $cm^3/g$ or more (refer to JP 2008-273816A).

The pore diameter of the mesopores can be calculated as distribution of the pores from a pore volume change rate in relation to the pore diameter, on the basis of the BJH method, for example. The BJH method is a method that is widely used as a pore diameter distribution analysis method. When the pore diameter distribution analysis is performed on the basis of the BJH method, first, a desorption isotherm is calculated, by adsorbing nitrogen as the adsorbed molecules on, and desorbing nitrogen from, the porous carbon particles. Then, on the basis of the calculated desorption isotherm, the thicknesses of an adsorption layer when the adsorbed molecules are adsorbed and desorbed in a step-by-step manner from a state in which the pores is filled with the adsorbed molecules (for example, nitrogen), and inner diameters of a hole generated then (twice the core radius) are calculated, and a pore radii $r_p$ are calculated on the basis of formula (1), and pore volumes are calculated on the basis of formula (2). Then, a pore diameter distribution curving line is obtained by plotting pore volume change rates ($dV_p/dr_p$) in relation to pore diameter (2rp) from the pore radii and the pore volumes (refer to the manual of BELSORP-mini and BELSORP analysis software produced by BEL Japan Inc., pp. 85-88).

$$r_p = t + r_k \quad (1)$$

$$V_{pn} = R_n \cdot dV_n - R_n \cdot dt_n \cdot c \cdot \Sigma A_{pj} \quad (2)$$

where $$R_n = r_{pn}^2 / (r_{kn-1} + dt_n)^2 \quad (3)$$

Here, $r_p$ is a pore radius;

$r_k$ is a core radius (inner diameter/2) when an adsorption layer of a thickness t is adsorbed on an inner wall of a pore of a pore radius rp at the pressure;

$V_{pn}$ is a pore volume when adsorption and desorption of nitrogen of the n-th time occur;

$dV_n$ is an amount of change at the time;

$dt_n$ is an amount of change of a thickness to of the adsorption layer when the adsorption and desorption of nitrogen of the n-th time occur;

$r_{kn}$ is a core radius at the time;

c is a fixed value; and $r_{pn}$ is a pore radius when the adsorption and desorption of nitrogen of the n-th time occur. Also, $\Sigma A_{pj}$ indicates an integrated value of areas of wall surfaces of pores from j=1 to j=n−1.

The pore diameters of the micropores can be calculated as distribution of the pores from the pore volume change rate in relation to the pore diameter, on the basis of the MP method, for example. When the pore diameter distribution analysis is performed by the MP method, first, an adsorption isotherm is calculated, by adsorbing nitrogen on the porous carbon particles. Then, this adsorption isotherm is converted to the pore volume in relation to the thickness t of the adsorption layer (t plot). Then, a pore diameter distribution curving line can be obtained on the basis of the curvature (the amount of change of the pore volume in relation to the amount of change of the thickness t of the adsorption layer) of the plotted (refer to the manual of BELSORP-mini and BELSORP analysis software produced by BEL Japan Inc., pp. 72-73 and 82).

In a non-local density functional method (NLDFT method) speculated in JIS Z8831-2:2010 "Pore size distribution and porosity of solid materials—Part 2: Analysis of mesopores and macropores by gas adsorption", and JIS Z8831-3:2010 "Pore size distribution and porosity of solid materials—Part 3: Analysis of micropores by gas adsorption", the software that comes with the automatic specific surface area and pore diameter distribution measurement device "BELSORP-MAX" produced by the BEL Japan Inc. is used as the analysis software. As a precondition, carbon black (CB) is assumed as a cylinder shape in the model, and the distribution function of pore diameter distribution parameter is set to "no-assumption", and smoothing is performed to the obtained distribution data 10 times.

The average particle diameter of the porous carbon particles is preferably 20 μm or less, more preferably 1 μm or more and 20 μm or less. Here, the average particle diameter is calculated as in the following. First, a SEM image of the conductive particles is captured by using a scanning electron microscope (SEM). Thereafter, 10 pieces of conductive particles are selected and picked out randomly from the SEM image, and the particle diameters of those particles are measured by using image analysis software. Here, the particle diameter means the maximum extension length (i.e., the maximum particle diameter) of a particle. This procedure is performed for ten SEM images, and the obtained particle diameters are simply averaged (arithmetic average) to calculate an average particle diameter.

It is preferable that the aspect ratio of the porous carbon particles is 10 or less. Here, the aspect ratio is calculated as in the following. First, a SEM image of the conductive particles is captured by using the SEM. Thereafter, the image analysis software is used to select and pick out 10 pieces of the conductive particles randomly from the SEM image, and to measure the diameters (major diameters) in the longitudinal direction of those particles and the diameters (minor diameters) in the shorter direction. Here, the diameter in the longitudinal direction means the maximum extension length (i.e., the maximum particle diameter) of a particle, and the diameter in the shorter direction means the length of the part that is longest in the perpendicular direction to the major axis. This procedure is performed for ten SEM images, in order to simply average (arithmetic average) each of the obtained diameters in the longitudinal direction and the diameters in the shorter direction to calculate the average diameter in the longitudinal direction and the average diameter in the shorter direction. Next, a ratio of the calculated average diameter (average major diameter) in the longitudinal direction to the average diameter (average minor diameter) in the shorter direction (i.e., (the average diameter in the longitudinal direction)/(the average diameter in the shorter direction)) is calculated as the aspect ratio.

Elastomer is used as the binder, for example. For example, one or more of silicone resin, acrylic resin, urethane resin, and the like can be used as the elastomer.

[2 Operation of Dielectric Actuator]

In the following, an example of operation of the dielectric actuator according to an embodiment of the present technology will be described.

(Operation at Time of Rated Voltage Application)

When the rated voltage is applied between both the electrodes $12a$, $12b$, attractive force by Coulomb force acts on both the electrodes $12a$, $12b$. Thereby, the dielectric layer 11 located between both the electrodes $12a$, $12b$ is pressed in the thickness direction so as to become thin, and stretches in the in-plane direction. Thereby, the dielectric actuator provides driving force in the thickness direction and the in-plane direction of the dielectric layer 11.

(Operation at Time of Excessive Voltage Application)

The electrodes $12a$, $12b$ become insulators, before the dielectric layer 11 suffers insulation breakdown by the voltage that is applied between the electrodes $12a$, $12b$. Specifically, the electrodes $12a$, $12b$ becomes the insulators due to rapid rise of resistance before the dielectric layer 11 suffers insulation breakdown, when an excessive voltage, such as a spike voltage, is applied between the electrodes $12a$, $12b$. Also, when the application voltage between the electrodes $12a$, $12b$ returns from the excessive voltage to the rated voltage, or when the application of the excessive voltage between the electrodes $12a$, $12b$ stops, the resistances of the electrodes $12a$, $12b$ decrease, and the electrodes $12a$, $12b$ returns from the insulators to the conductors.

The electrodes $12a$, $12b$ becomes the insulators, when voltage is applied in such a manner that the electric field strength between the electrodes $12a$, $12b$ is 100 [MV/m] or more, for example. The surface resistances of the electrode $12a$ $12b$ that has become the insulators are preferably 1 MΩ/☐ or more, more preferably 10 MΩ/☐ or more, yet more preferably 100 MΩ/☐ or more.

There is no obvious reason for the electrodes $12a$, $12b$ to become the insulators due to the rapid resistance rise before the dielectric layer 11 suffers insulation breakdown at the time of the application of the excessive voltage as described above, but the reason is guessed as in the following. It is guessed that, when the excessive voltage is applied between the electrodes $12a$, $12b$, the contacting points between the porous carbon particles included in the electrodes $12a$, $12b$, and/or the contacting points between the particles group (for example, aggregate) in which a plurality of porous carbon particles aggregate rapidly decrease before the dielectric layer 11 suffers insulation breakdown, because of the stretching of the electrodes $12a$, $12b$. Also, it is guessed that the rapid decrease of the contacting points results from the structure of a specific porous carbon particle, such as biocarbon.

[3 Production Method of Dielectric Actuator]

In the following, an example of a production method of the dielectric actuator according to an embodiment of the present technology will be described.

First, the conductive particles are added and dispersed in a solvent, and thereby a conductive ink which is a paint for forming an electrode is prepared. A binder and/or additive may also be added to the solvent as necessary. For example, additives, such as surfactant, viscosity modifier, and dispersant, may be added as necessary for the purpose of improving coating to the dielectric layer 11 and the pot life of composition. It is preferable that stirring, ultrasonic wave dispersion, beads dispersion, kneading, homogenizer process, or the like is used as a dispersion method.

Any solvent that can disperse the conductive particles may be used, and the solvent is not limited particularly. For example, water, ethanol, methyl ethyl ketone, isopropanol alcohol, acetone, anone (cyclohexanone, cyclopentanone), hydrocarbon (hexane), amide (DMF), sulfide (DMSO), butyl cellosolve, butyl triglycol, propylene glycol monomethyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, methyl glycol, terpineol, butyl carbitol acetate, and the like are listed.

Next, a coating film is formed on one surface of the dielectric layer 11, by using the conductive ink that is prepared as described above. A formation method of the coating film is not limited particularly, and a wet film forming method is preferable in consideration of physical property, convenience, production cost, etc. For example, a publicly known method, such as a coating method, a spray method, and a printing method, can be used as the wet film forming method. The coating method is not limited particularly, and can use a publicly known coating method. The publicly known coating method is, for example, a micro gravure coating method, a wire bar coating method, a direct gravure coating method, a die coating method, a dip method, a spray coating method, a reverse roll coating method, a curtain coating method, a comma coating method, a knife coating method, a spin coating method, or the like. The printing method is, for example, a relief printing method, an offset printing method, a gravure printing method, an intaglio printing method, a rubber plate printing method, a screen printing method, an ink-jet printing method, or the like.

Next, the solvent is vaporized by drying the coating film that is formed on the one surface of the dielectric layer 11. A drying condition is not limited particularly, and may be either one of natural drying and drying by heating. Thereby, the electrode 12a is formed on the surface of the dielectric layer 11.

Next, the electrode 12b is formed on the other surface of the dielectric layer 11, in the same way as the electrode 12a formed on the one surface of the dielectric layer 11. As described above, a targeted dielectric actuator is obtained.

Although, in the above example of the production method of the dielectric actuator, an example has been described in which the electrode 12a is formed on the one surface of the dielectric layer 11 and thereafter the electrode 12b is formed on the other surface of the dielectric layer 11, the production method of the dielectric actuator is not limited to this example. For example, it may be such that the coating films are simultaneously formed by using the conductive ink on the both surfaces of the dielectric layer 11, and thereafter the electrodes 12a, 12b are fabricated by drying those coating films simultaneously or sequentially. Also, it may be such that the electrodes 12a, 12b are fabricated as self-supported films, such as green sheet, in advance, and those electrodes 12a, 12b are bonded via bonding layers on the both surfaces of the dielectric layer 11, respectively.

[4 Effect]

According to an embodiment of the present technology, when excessive voltage (for example, several kV), such as a spike voltage, is applied between both the electrodes 12a, 12b, the electrodes 12a, 12b become the insulators due to the rapid rise of the resistance, before the dielectric layer 11 suffers insulation breakdown. Also, when the application voltage between the electrodes 12a, 12b returns from the excessive voltage to the rated voltage, the resistances of the electrodes 12a, 12b decrease so that the electrodes 12a, 12b return to the conductors. Thus, even when the excessive voltage, such as the spike voltage, is applied between the electrodes 12a, 12b, insulation breakdown of the dielectric layer 11 is prevented, and malfunction and breakage of the dielectric actuator can be prevented. Also, the operation durability of the dielectric actuator can be improved.

[5 Exemplary Variant]

Although in the above embodiment an example of configuration has been described in which, when the excessive voltage is applied, both electrodes provided on the both surfaces of the dielectric layer become the insulators due to the rapid rise of the resistance before the dielectric layer suffers insulation breakdown, the present technology is not limited to this example. That is, it may be a configuration in which, when the excessive voltage is applied, one of both electrodes provided on the both surfaces of the dielectric layer becomes an insulator by the rapid rise of the resistance before the dielectric layer suffers insulation breakdown.

Also, although in the above embodiment an example has been described in which the dielectric actuator has a single layer structure, the dielectric actuator may have a stacked layer structure that repeatedly stacks electrodes and dielectric layers alternatingly.

WORKING EXAMPLE

In the following, the present technology is specifically described with working examples, but the present technology is not limited to these working examples only.

In the present working example, the pore diameter, the average particle diameter, and the aspect ratio of biocarbon are calculated by the method that is described in above embodiment.

Working Example 1

First, powder of biocarbon (BC) is prepared. The used biocarbon is made from a raw material that is a plant-derived material in which the content of silicon is 5 wt % or more, and includes micropores of pore diameter of less than 2 nm and mesopores of pore diameter of 2 nm or more and 50 nm or less, and has an average particle diameter of 20 μm or less, and has an aspect ratio of 10 or less.

Next, electrodes are formed by coating the prepared biocarbon powder on both surfaces of an acrylic resin film as a dielectric elastomer film (dielectric layer). As described above, the targeted dielectric elastomer actuator is obtained.

Comparative Example 1

A dielectric elastomer actuator is obtained in the same way as working example 1, except for using powder of vapor grown carbon fiber (VGCF), instead of the powder of the biocarbon.

Comparative Example 2

An dielectric elastomer actuator is obtained in the same way as working example 1, except for using powder of ketchen black (KB), instead of the powder of the biocarbon.

Evaluation

Following evaluation is performed with regard to the dielectric elastomer actuators of working example 1 and comparative examples 1, 2 which are obtained as described above.

(Area Change Rate)

Figure 2:
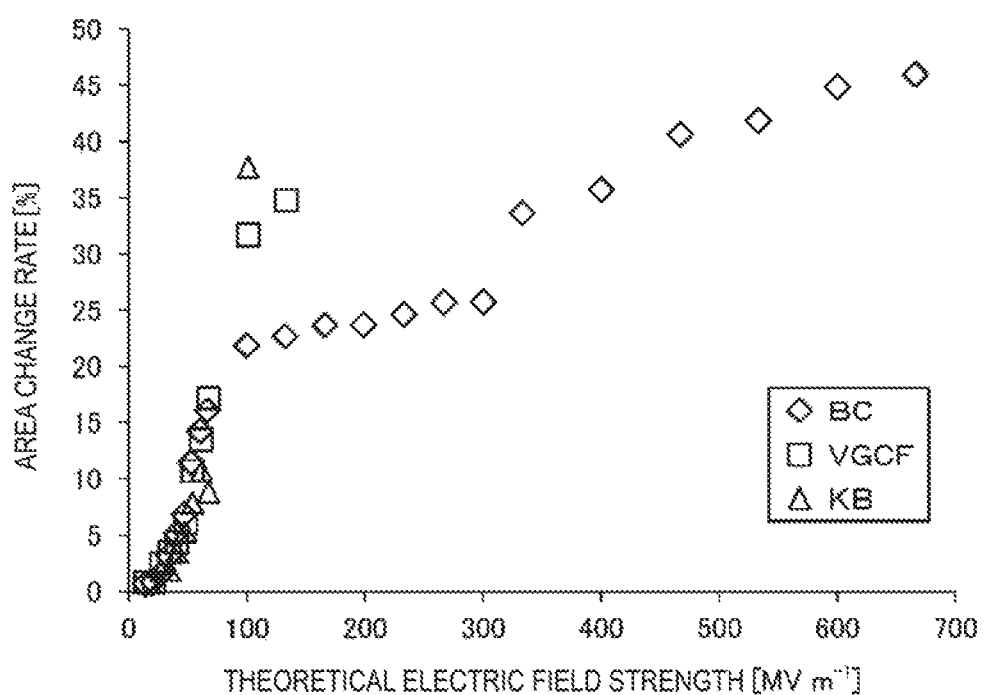
FIG. 2 is a diagram illustrating a relationship between a theoretical electric field strength and an area change rate in a dielectric actuator of working example 1.

Change of the area change rate in relation to the theoretical electric field strength of the dielectric elastomer actuator is measured. The result is illustrated in FIG. 2. Here, the theoretical electric field strength means the electric field strength between the electrodes that is calculated from the voltage (power-supply voltage) that is applied to the dielectric elastomer actuator, and is distinguished from the electric field strength between the real electrodes (hereinafter, referred to as "real electric field strength").

(Surface Resistance)

Change of the surface resistance in relation to the area change rate of the dielectric elastomer actuator is measured by a four probe method.

The above evaluation result reveals below.

In the dielectric elastomer actuator of working example 1, the area change rate increases as the theoretical electric field strength increases, within the range of the theoretical electric field strength from 0 [MV/m] to 100 [MV/m]. On the other hand, the area change rate remains substantially constant in relation to the increase of the theoretical electric field strength, within the range of the theoretical electric field strength from 100 [MV/m] to 300 [MV/m]. Also, in the dielectric elastomer actuator of working example 1, the surface resistance of the electrode increases as the area change rate increases, and exceeds the measurement range (order of MΩ) of the measurement device.

The above tendency is considered to be due to the below reason. That is, it is considered that the electrode made of the biocarbon functions as a conductor, within the range of the theoretical electric field strength from 0 [MV/m] to 100 [MV/m], and thus the real electric field strength rises, and the area change rate increases, as the theoretical electric field strength increases. On the other hand, within the range of the theoretical electric field strength from 100 [MV/m] to 300 [MV/m], the electrode made of the biocarbon does not function as the conductor, and the electric charge that is accumulated before the theoretical electric field strength reaches 100 [MV/m] is maintained. Hence, even if the theoretical electric field strength is increased, the real electric field strength is maintained at a substantially constant value, and thus the area change rate is also maintained at a substantially constant value.

In the dielectric elastomer actuators of comparative examples 1, 2, an electric field strength region in which the area change rate is substantially constant in relation to the increase of the theoretical electric field strength does not exist, and the area change rate rapidly increases as the theoretical electric field strength increases, as compared with the dielectric elastomer actuator of working example 1. Also, in the dielectric elastomer actuators of comparative examples 1, 2, the surface resistance of the electrode does not increase significantly in relation to the increase of the area change rate, and the electrical conductivity of the electrode is maintained.

The above tendency is considered to be due to the below reason. That is, it is considered that the electrode made of VGCF or KB functions as a conductor regardless of the range of the theoretical electric field strength, and thus the real electric field strength continues rising as the theoretical electric field strength increases, and the increase of the area change rate is maintained.

In the above, the embodiments, the exemplary variants, and the working examples of the present technology have been described specifically, but the present technology is not limited to the above embodiments, the exemplary variants, and the working examples, but may be modified variously on the basis of the technical idea of the present technology.

For example, the configurations, the methods, the processes, the shapes, the materials, and the numerical values, and the like in the above embodiments, the exemplary variants, and the working examples are merely examples, and different configuration, method, process, shape, material, numerical value and the like may be used as necessary.

Also, the configurations, the methods, the processes, the shapes, the materials, the numerical values, and the like of the above embodiments, the exemplary variants, and the working examples can be combined with each other, as long as it does not deviate from the spirit of the present technology.

Additionally, the present technology may also be configured as below.

(1)

A transducer that converts electrical energy to mechanical energy, the transducer including:
a dielectric layer;
a first electrode that is provided on one surface of the dielectric layer; and
a second electrode that is provided on another surface of the dielectric layer,
wherein at least one of the first electrode and the second electrode becomes an insulator, before the dielectric layer suffers insulation breakdown by voltage that is applied between the first electrode and the second electrode.

(2)

The transducer according to (1), wherein
at least one of the first electrode and the second electrode includes porous carbon particles.

(3)

The transducer according to (2), wherein
the porous carbon particles include pores each having a pore diameter of 2 nm or more and 100 nm or less on surfaces.

(4)

The transducer according to (3), wherein
the porous carbon particles further include pores each having a pore diameter of 0.5 nm or more and less than 2 nm on the surfaces.

(5)

The transducer according to (2), wherein
the porous carbon particles include pores each having a pore diameter of 0.5 nm or more and less than 2 nm and pores each having a pore diameter of 4 nm or more and 20 nm or less on surfaces.

(6)

The transducer according to any one of (2) to (5), wherein
an average particle diameter of the porous carbon particles is 1 μm or more and 20 μm or less.

(7)

The transducer according to any one of (2) to (6), wherein
an aspect ratio of the porous carbon particles is 10 or less.

(8)

The transducer according to any one of (2) to (7), wherein
the porous carbon particles are made from a raw material that is a plant derived material in which a content of silicon is 5 mass % or more.

(9)

The transducer according to any one of (2) to (8), wherein
the porous carbon particles are biocarbon.

(10)

The transducer according to any one of (2) to (9), wherein
the first electrode and the second electrode further include a binder.

(11)

The transducer according to any one of (1) to (10), further including:
a first bonding layer that is provided between the first electrode and the dielectric layer; and
a second bonding layer that is provided between the second electrode and the dielectric layer.

(12)

An electronic device including:
the transducer according to any one of (1) to (11).

REFERENCE SIGNS LIST 11 dielectric layer
12a, 12b electrode
13a, 13b line
14 power supply

The invention claimed is:

1. A transducer, comprising:
a dielectric layer;
a first electrode on a first surface of the dielectric layer; and
a second electrode on a second surface of the dielectric layer, wherein
the transducer is configured to convert electrical energy to mechanical energy, and
at least one of the first electrode or the second electrode is configured to become an insulator, before the dielectric layer suffers insulation breakdown by voltage that is applied between the first electrode and the second electrode.

2. The transducer according to claim 1, wherein at least one of the first electrode or the second electrode includes porous carbon particles.

3. The transducer according to claim 2, wherein the porous carbon particles include pores each having a pore diameter of 2 nm or more and 100 nm or less on surfaces.

4. The transducer according to claim 3, wherein the porous carbon particles further include pores each having a pore diameter of 0.5 nm or more and less than 2 nm on the surfaces.

5. The transducer according to claim 2, wherein the porous carbon particles include pores each having a pore diameter of 0.5 nm or more and less than 2 nm and pores each having a pore diameter of 4 nm or more and 20 nm or less on surfaces.

6. The transducer according to claim 2, wherein an average particle diameter of the porous carbon particles is 1 µm or more and 20 µm or less.

7. The transducer according to claim 2, wherein an aspect ratio of the porous carbon particles is 10 or less.

8. The transducer according to claim 2, wherein the porous carbon particles are made from a raw material that is a plant derived material in which a content of silicon is 5 mass % or more.

9. The transducer according to claim 2, wherein the porous carbon particles are biocarbon.

10. The transducer according to claim 2, wherein each of the first electrode and the second electrode further includes a binder.

11. The transducer according to claim 1, further comprising:
a first bonding layer between the first electrode and the dielectric layer; and
a second bonding layer between the second electrode and the dielectric layer.

12. An electronic device, comprising:
a transducer configured to convert electrical energy to mechanical energy, wherein
the transducer includes:
a dielectric layer;
a first electrode on a first surface of the dielectric layer; and
a second electrode on a second surface of the dielectric layer, and
at least one of the first electrode or the second electrode is configured to become an insulator, before the dielectric layer suffers insulation breakdown by voltage that is applied between the first electrode and the second electrode.

* * * * *